United States Patent
Visokay et al.

(10) Patent No.: US 6,936,508 B2
(45) Date of Patent: Aug. 30, 2005

(54) METAL GATE MOS TRANSISTORS AND METHODS FOR MAKING THE SAME

(75) Inventors: Mark Visokay, Richardson, TX (US); Luigi Colombo, Dallas, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/661,130

(22) Filed: Sep. 12, 2003

(65) Prior Publication Data
US 2005/0059198 A1 Mar. 17, 2005

(51) Int. Cl.[7] ............... H01L 21/8238; H01L 21/3205; H01L 29/76
(52) U.S. Cl. ............. 438/199; 438/591; 257/388; 257/407; 257/412
(58) Field of Search ............. 438/199, 591, 438/592; 257/388, 407, 412

(56) References Cited

U.S. PATENT DOCUMENTS

| | | | |
|---|---|---|---|
| 4,628,588 A | | 12/1986 | McDavid |
| 4,641,417 A | | 2/1987 | McDavid |
| 4,672,419 A | | 6/1987 | McDavid |
| 4,954,867 A | | 9/1990 | Hosaka |
| 5,625,217 A | * | 4/1997 | Chau et al. .............. 257/412 |
| 5,633,522 A | | 5/1997 | Dorleans et al. |
| 5,723,893 A | | 3/1998 | Yu et al. |
| 5,937,315 A | | 8/1999 | Xiang et al. |
| 6,255,698 B1 | * | 7/2001 | Gardner et al. .............. 257/369 |
| 6,274,467 B1 | * | 8/2001 | Gambino et al. .............. 438/563 |
| 6,376,342 B1 | | 4/2002 | Tseng |
| 6,410,967 B1 | | 6/2002 | Hause et al. |
| 6,432,817 B1 | | 8/2002 | Bertrand et al. |
| 6,483,151 B2 | * | 11/2002 | Wakabayashi et al. ...... 257/369 |
| 6,544,876 B1 | * | 4/2003 | Iyer .............. 438/592 |
| 6,602,781 B1 | | 8/2003 | Xiang et al. |
| 6,614,082 B1 | * | 9/2003 | DeBoer et al. .............. 257/412 |
| 6,617,624 B2 | | 9/2003 | Powell |
| 6,645,798 B2 | * | 11/2003 | Hu .............. 438/197 |
| 6,653,700 B2 | * | 11/2003 | Chau et al. .............. 257/412 |
| 6,693,333 B1 | * | 2/2004 | Yu .............. 257/407 |
| 2003/0109121 A1 | | 6/2003 | Rotondaro |
| 2003/0122199 A1 | * | 7/2003 | Koyama et al. .............. 257/369 |

OTHER PUBLICATIONS

"An Investigation of Molybdenum Gate for Submicrometer CMOS", Robert F. Kwasnick, Edmund B, Kaminsky, Paul A. Frank, Gerhard A Franz, Kenneth J. Polasko, Richard J Iaia and Thomas B. Gordzya, IEEE Transactions on Electron Devices, vol. 35, No. 9, Sep., 1988, pp. 1432–1438.

(Continued)

Primary Examiner—Matthew Smith
Assistant Examiner—Lex H. Malsawma
(74) Attorney, Agent, or Firm—Jacqueline J. Garner; W. James Brady, III; Frederick J. Telecky, Jr.

(57) ABSTRACT

Semiconductor devices and fabrication methods are provided, in which metal transistor gates are provided for MOS transistors. Metal boride is formed above a gate dielectric to create PMOS gate structures and metal nitride is formed over a gate dielectric to provide NMOS gate structures. The metal portions of the gate structures are formed from an initial starting material that is either a metal boride or a metal nitride, after which the starting material is provided with boron or nitrogen in one of the PMOS and NMOS regions through implantation, diffusion, or other techniques, either before or after formation of the conductive upper material, and before or after gate patterning. The change in the boron or nitrogen content of the starting material provides adjustment of the material work function, thereby tuning the threshold voltage of the resulting PMOS or NMOS transistors.

30 Claims, 10 Drawing Sheets

OTHER PUBLICATIONS

"Silicon Processing for the VLSI Era, vol. 2: Process Integration", Stanley Wolf, Ph.D., Copyright, 1990 by Lattice Press, 7 pgs.

"Electrical Characteristics of $TiB_2$ for ULSI Applications", Chang Sik Choi, Qingfeng Wang, Carlton M. Osburn, Gary A. Ruggles and Ayan S. Shah, IEEE Transactions on Electron Devices, vol. 39, No. 10, Oct., 1992, pp. 2341–2345.

"FinFET Process Refinements for Improved Mobility and Gate Work Function Engineering", Yang–Kyu Choi, Leland Chang, Pushkar Ranade, Jeong–Soo Lee, Daewon Ha, Sriram Balasubramanian, Aditya Agarwal, Mike Ameen Tsu–Jae King and Jeffrey Bokor, IEEE, 2002, 4 pgs.

"$MO_2N$/Mo Gaff MOSFETs", Manjin J. Kim and Dale M. Brown, IEEE, 1982, 4 pgs.

"Application of $MoSi_2$ to the Double–Level Interconnections of $I^2L$ Circuits", Yoshitaka Sasaki, Osamu Ozawa and Shuichi Kameyama, IEEE Transactions on Electron Devices, vol. ED–27, No. 8, Aug. 1980, 5 pgs.

"Fabrication of Mo–Gate/Ti–Silicide–Clad–Moat MOS Devices by Use of Multilayer–Glass Depositions", J. M. McDavid, IEEE Electron Device Letters, vol. EDL–5, No. 9, Sep., 1984, 2 pgs.

"Lightly Impurity Doped (LD) Mo Silicide Gate Technology", Masakazu Kakumu and Jun'ichi Matsunaga, IEEE, 1985, 4 pgs.

* cited by examiner

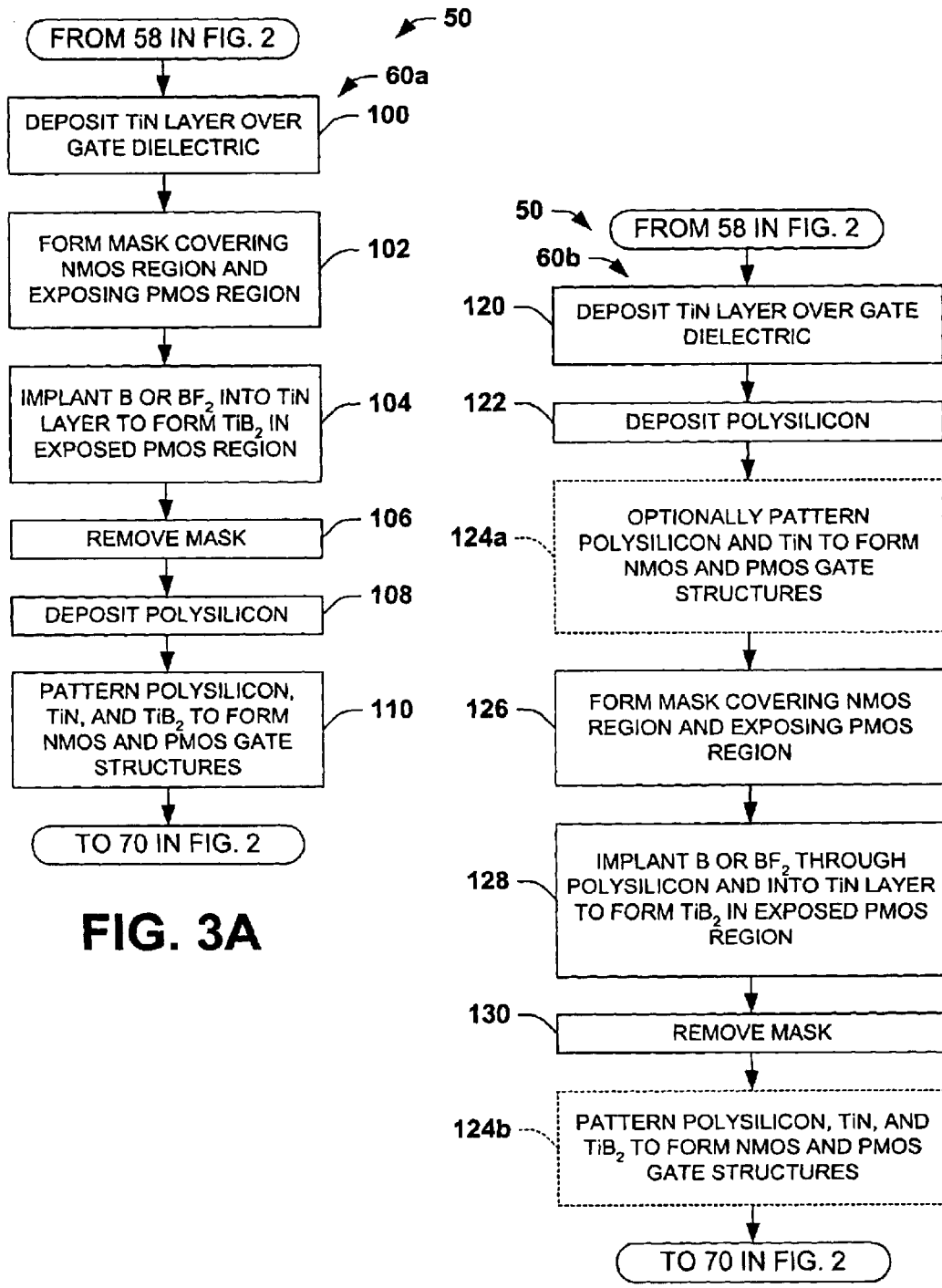

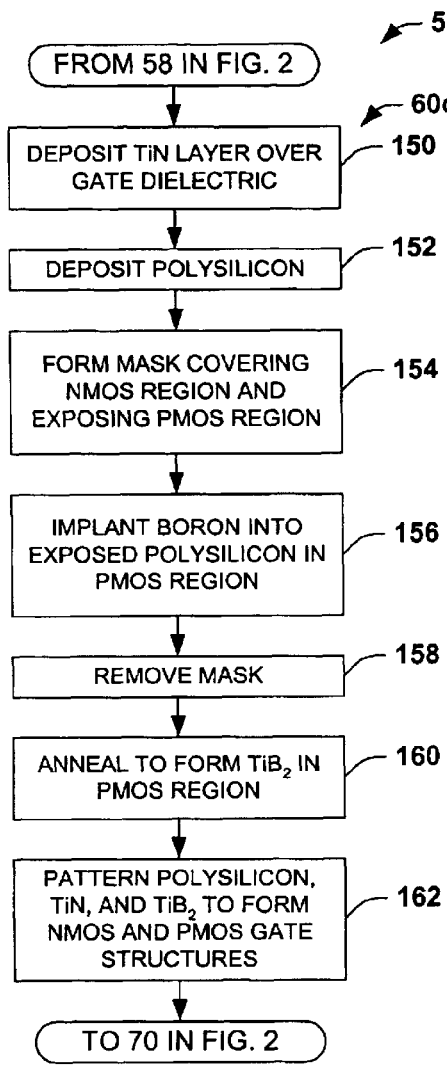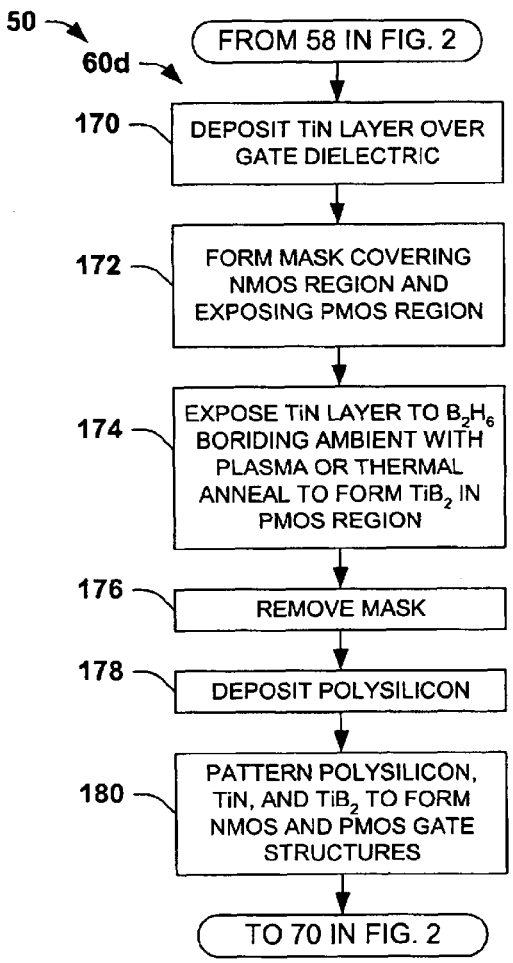
FIG. 3C
FIG. 3D

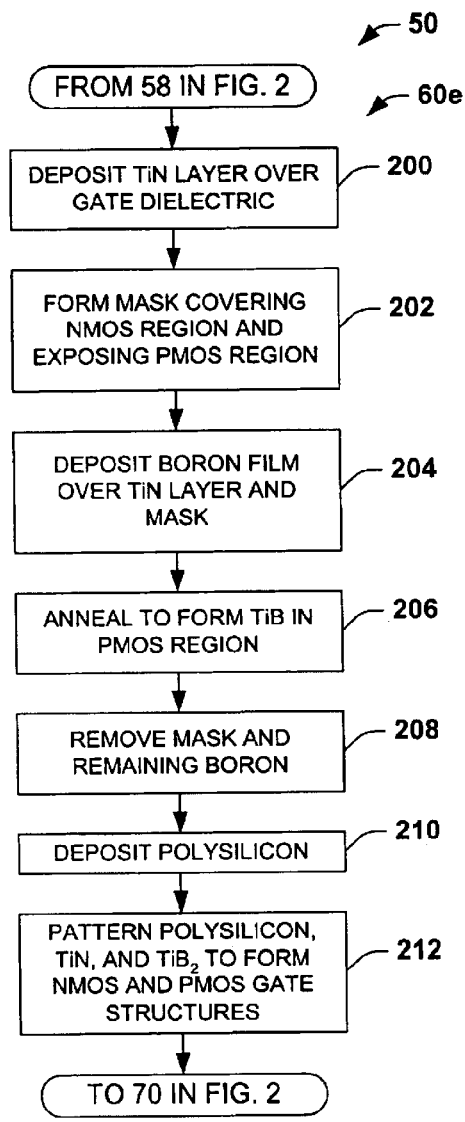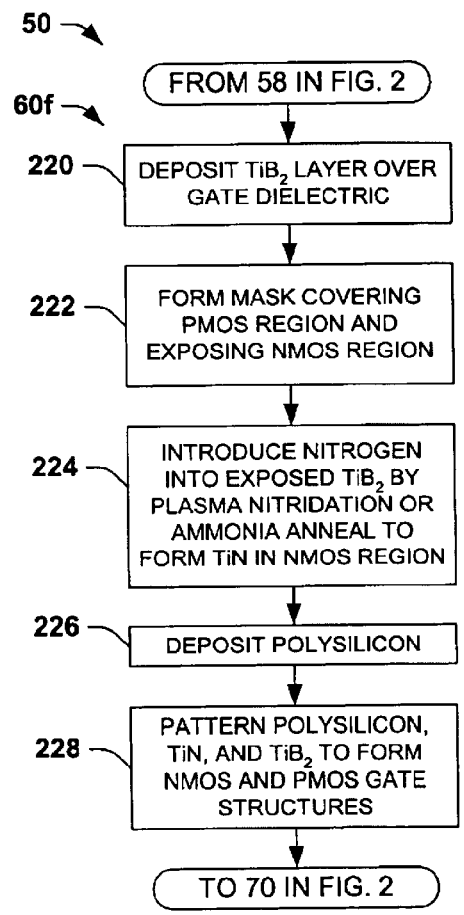
FIG. 3E
FIG. 3F

METAL GATE MOS TRANSISTORS AND METHODS FOR MAKING THE SAME

FIELD OF INVENTION

The present invention relates generally to semiconductor devices and more particularly to metal gate MOS transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate contact or electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complimentary MOS (CMOS) devices have become widely used in the semiconductor industry, wherein both n-channel and p-channel (NMOS and PMOS) transistors are used to fabricate logic and other circuitry. For enhancement-mode (e.g., normally off) devices the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the work functions of the PMOS and NMOS gate contact and the corresponding channel materials are independently tuned or adjusted through gate and channel engineering, respectively.

Channel engineering typically includes shallow dopant implants to the prospective channel regions of the semiconductor body, sometimes referred to as threshold adjust (Vt adjust) implants, where the implanted impurities behave as a sheet of fixed charge located under the gate oxide. A Vt adjust implant for the NMOS devices introduces boron or other p-type impurities into the NMOS channel region to raise the channel work function (sometimes referred to as a VTN implant), and a Vt adjust implant for the PMOS devices introduces arsenic, phosphorus, or other n-type impurities to lower the PMOS channel work function (VTP implant). In this manner, the Vt for the channels can be separately adjusted for NMOS and PMOS devices. Channel engineering typically includes multiple implants, for example, a Vt adjust implant, a punch-thru implant to suppress punch-through, and a channel stop implant, for each of the NMOS and PMOS devices.

Gate engineering is employed in combination with channel engineering to adjust the work function of the gate contact materials, where different gate work function values are set for PMOS and NMOS gates. The need to independently adjust PMOS and NMOS gate work functions has made poly-silicon attractive for use as a gate contact material in CMOS processes, since the work function of poly-silicon can be easily raised or lowered by doping the poly-silicon with p-type or n-type impurities, respectively. The PMOS poly-silicon gates are typically doped with p-type impurities and NMOS gate poly-silicon is doped with n-type dopants, typically during implantation of the respective source/drain regions following gate patterning. In this way, the final gate work functions are typically near the Si conduction band edge for NMOS and near the valence band edge for PMOS. The provision of dopants into the poly-silicon also has the benefit of increasing the conductivity of the gate contact. Poly-silicon has thusfar been widely using in the fabrication of CMOS devices, wherein the gate engineering (e.g., implants) are conventionally tuned to provide a desired gate contact conductivity (e.g., sheet resistance value), and the threshold voltage fine tuning is achieved by tailoring the Vt adjust implants to change the channel work function.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying poly-silicon layer are formed at 20 and 22, respectively, and the poly-silicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures At 32, the PMOS source/drain regions and the PMOS poly-silicon gate structures are implanted with p-type dopants to further define the PMOS source/drains, and to render the PMOS gates conductive. Similarly, the NMOS source/drain regions and the NMOS poly-silicon gate structures are implanted at 34 with n-type dopants, further defining the NMOS source/drains and rendering the NMOS gates conductive. Thereafter, the source/drains and gates are silicided at 36 and back end processing (e.g., interconnect metalization, etc.) is performed at 38, before the process 10 ends at 40. In the conventional process 10, the channel engineering implants at 16 and 18 shift the work functions of the PMOS and NMOS channel regions, respectively, to compensate for the changes in the PMOS and NMOS poly-silicon gate work functions resulting from the source/drain implants at 32 and 34, respectively. In this manner, the desired work function difference between the gates and channels may be achieved for the resulting PMOS and NMOS transistors, and hence the desired threshold voltages.

The gate dielectric or gate oxide between the channel and the gate contact is an insulator material, typically $SiO_2$ or other dielectric, that operates to prevent large currents from flowing from the gate contact into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin $SiO_2$ gate dielectric layers to prevent dopant diffusion from the gate poly-silicon into the underlying channel. Accordingly, recent scaling efforts have focused on high-k dielectric materials having dielectric constants greater than that of $SiO_2$, which can be formed in a thicker layer than scaled $SiO_2$, and yet which produce equivalent field effect performance. A thicker high-k dielectric layer can thus be formed to avoid or mitigate tunneling leakage currents, while still achieving the required electrical performance equivalent (e.g., capacitance value) to a thinner $SiO_2$.

Another shortcoming of scaled CMOS devices having poly-silicon gate contacts is known as polysilicon depletion. Polysilicon depletion occurs when annealing or other thermal back-end processing following the implants at 32 and 34 is insufficient to drive the implanted impurities down the entire depth of the poly-silicon gate structures. In this situation, a bottom portion of the poly-silicon gate contact near the gate dielectric is "depleted" of charges, and acts as an insulator. The depleted portion of the gate contact and the gate dielectric operate as series connected capacitors, resulting in a reduced effective gate capacitance, which reduces the drive current capability of the device. Consequently, poly-silicon depletion causes reduction in device performance which leads to poor unscalable devices. Simply increasing the implant energy and/or anneal time to combat poly depletion has adverse results, in that the corresponding depths of the concurrently implanted source/drain regions are increased.

With the relatively thick gate dielectrics and gate contact structures of the past, poly depletion was not critical to ensuring desired device performance. However, as gate dielectrics and gate contacts continue to become smaller through scaling, the poly-silicon depletion problem is more pronounced, wherein poly-silicon depletion regions of 3 to 4 angstroms become a significant fraction of the overall effective gate capacitance. Thus, while poly-silicon gate contacts have previously offered flexibility in providing dual work functions for CMOS processes, the future viability of conventional poly-silicon gate technology is lessened as scaling efforts continue. Accordingly, attention has recently been directed again to the possibility of using metal gate contacts in CMOS products, where the metal gate materials conceivably do not need doping for conductivity improvement. Although this approach presumably avoids poly-silicon depletion issues with respect to gate capacitance, there remains a need for dual or differentiated work function capability (e.g., for PMOS and NMOS transistors) in CMOS processes. In this regard, metal work functions are not shifted as easily by the same amounts as was the case for poly-silicon. Accordingly, there is a need for improved CMOS transistor gate designs and fabrication techniques by which the benefits of scaling can be achieved while avoiding or mitigating the poly depletion degradation found in conventional devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to semiconductor device fabrication methodologies and semiconductor devices, in which metal transistor gates are provided for PMOS and NMOS transistors having differentiated work functions to facilitate elimination or mitigation of poly-silicon depletion problems. Metal boride is formed above a gate dielectric to create PMOS gate structures, while metal nitride is formed over a gate dielectric to provide NMOS gate structures.

The inventors have appreciated that while doping can be used to easily provide desired gate work functions for poly-silicon (e.g., 4.2 eV and 4.9 eV for NMOS and PMOS transistors, respectively), changing the work function of metals is more difficult. Furthermore, most metals suitable for use in transistor gate designs do not inherently have one of the two desired work functions. For example, TiN has a work function of about 4.4 to 4.6 eV, essentially at the middle of the range between the desired PMOS and NMOS target values. Thus, the work function of a TiN gate is not optimized for either PMOS or NMOS transistors. PMOS and NMOS channel engineering can be used to compensate for such a gate design, but these techniques are primarily used for fine tuning the gate to substrate work function difference, and are not generally suitable for large adjustments in work function values. Furthermore, it is desirable to avoid gate processing which uses two separate metals, as etch processing and other fabrication steps may be hard to optimize for two different metals.

One aspect of the invention advantageously allows the use of a single starting material for the metal gate contact portion of the gate structures of both PMOS and NMOS devices, where the starting material is a metal boride or a metal nitride. The metal boride may be any boron-containing metal material, including alloys, and the metal nitride may be any nitrogen-containing metal or nitrogen-containing metal alloy. The starting material is provided with boron or nitrogen in one of the PMOS and NMOS regions through implantation, diffusion, or other suitable techniques, either before or after poly-silicon or tungsten formation, and before or after gate patterning. The change in the boron or nitrogen content of the starting material provides adjustment of the material work function, thereby tuning the threshold voltage of at least one of the resulting PMOS or NMOS transistors without significant channel engineering, and without the process complications inherent in using two different starting metal materials.

In one implementation, the starting material is tailored to provide one of the two desired final gate work functions, whereby channel engineering for the corresponding transistor type (e.g., PMOS or NMOS) can be avoided or may be simplified. For example, the starting material may include $Ta_XN_Y$ having an initial work function of about 4.3 that may be suitable for NMOS devices, whereby NMOS channel engineering may be simplified or eliminated. Boron may then be introduced into the $Ta_XN_Y$ in the PMOS region to create $Ta_XB_Y(N)$ having the desired (e.g., or close) PMOS work function, whereby little or no PMOS channel engineering may be required.

In another possible implementation, a starting material may be selected having an initial work function value near one of the desired gate work functions, and may then be provided with dopants to achieve the desired value without the need for substantial channel engineering. In this situation, channel engineering will only be needed for the other transistor type (e.g., PMOS or NMOS). For example, a mid-gap metal such as TiN with a work function of about 4.4 to 4.6 eV may be formed over the gate dielectrics in both NMOS and PMOS regions. The TiN in the PMOS region is then provided with boron to create a metal boride $TiB_2$ having a work function of 4.9 eV, which is the desired PMOS value. As a result, little or no PMOS channel engineering is needed, thereby reducing process time, complexity, cost, etc., and also providing a further advantage in that less dopants are provided in the PMOS channel, which increases channel carrier mobility. Normal channel engineering can then be used to compensate the NMOS channel regions for the TiN gate work function in the NMOS transistors.

In yet another implementation, a metal boride is used as the starting material, and nitrogen is selectively introduced in the NMOS regions to provide a metal nitride having a different work function. For example, $TiB_2$ may be initially formed, having the desired 4.9 eV work function for PMOS devices. The $TiB_2$ in the NMOS regions is then nitrided to create TiN, wherein channel engineering can again be used to adjust the NMOS channel work function accordingly. The invention thus provides for the possibility of using a single starting material, and the possibility of eliminating or simplifying the channel engineering for at least one of the transistor types, while also realizing the other advantages of metal gates (e.g., higher conductivity, minimum depletion, etc.).

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 3A–3F are partial flow diagrams illustrating various techniques for forming tuned PMOS and NMOS metal gate structures with differentiated work functions in the fabrication method of FIG. 2;

DETAILED DESCRIPTION OF THE INVENTION

Figure 1:
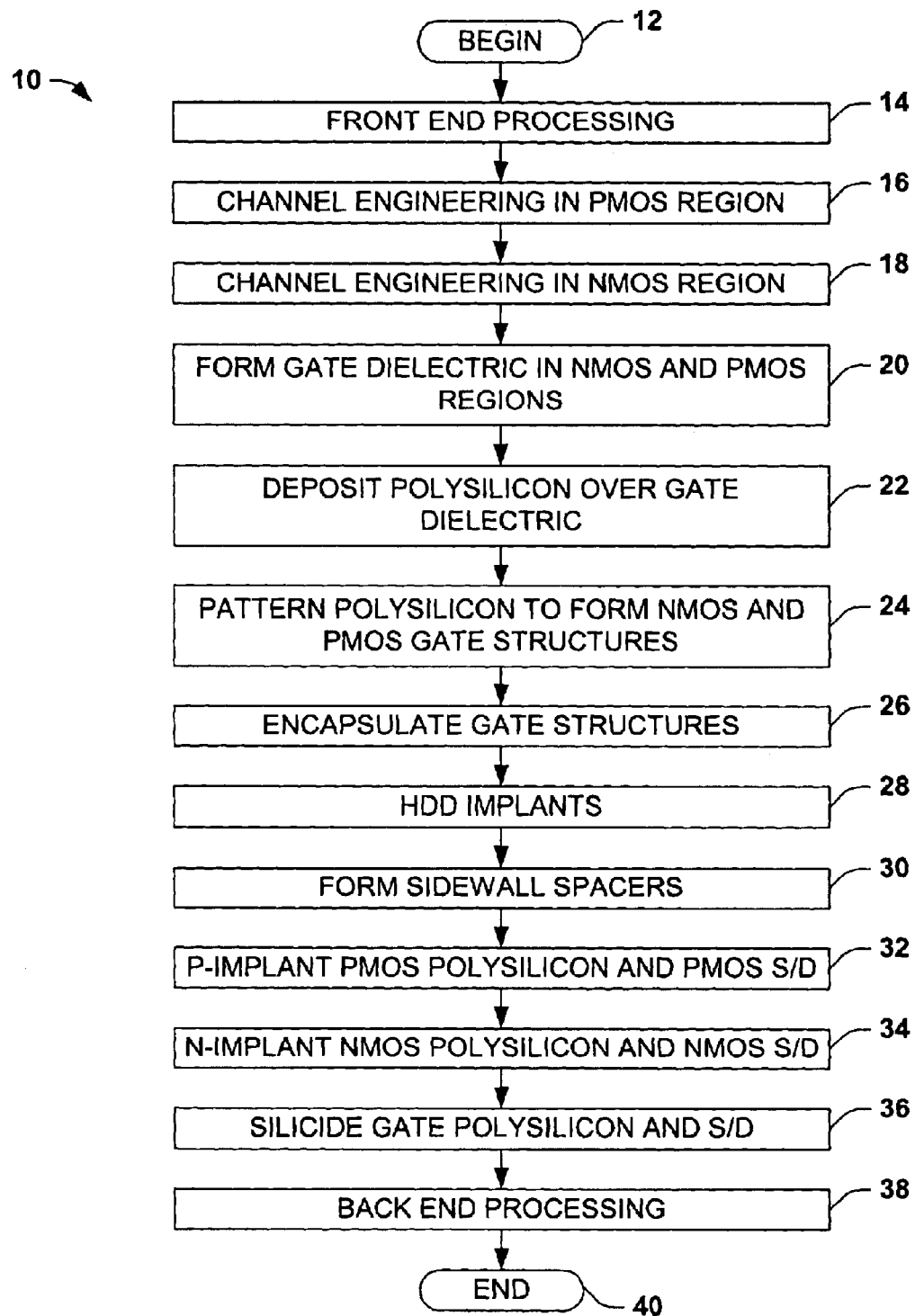
FIG. 1 is a simplified flow diagram illustrating a conventional poly-silicon gate CMOS fabrication process including channel engineering for both PMOS and NMOS transistors.

One or more implementations of the present invention will now be described with reference to the attached drawings, wherein like reference numerals are used to refer to like elements throughout, and wherein the illustrated structures are not necessarily drawn to scale. The invention relates to metal gate CMOS devices and fabrication methods in which metal nitride and metal boride gate contact materials are used for NMOS and PMOS transistors, respectively. The invention may be employed to simplify channel engineering steps in particular, and fabrication processing generally, while mitigating or eliminating the poly depletion shortcomings of conventional CMOS devices, and without having to use different metal starting materials in gate fabrication.

In the methods and devices of the invention, metal nitride is formed above a gate dielectric in an NMOS region and metal boride is formed above the gate dielectric in a PMOS region, wherein these and the gate dielectric may be formed by separate processes for the NMOS and PMOS regions. As used herein, metal nitrides are any materials comprising metal and nitrogen content, including but not limited to metal nitrides, metal silicon nitrides, metal aluminum nitrides, and metal aluminum silicon nitrides. Further, as used herein, metal borides are any materials comprising metal and boron content, including but not limited to metal borides, metal silicon borides, metal aluminum borides, and metal aluminum silicon borides. In the examples illustrated and described herein, moreover, a single metal nitride or metal boride starting material may be concurrently formed above the gate dielectric in both the NMOS region and the PMOS region, for example, using a single deposition process. The starting material is then changed in a first one of the NMOS region and the PMOS region such that a metal nitride is provided above the gate dielectric in the NMOS region and a metal boride is provided above the gate dielectric in the PMOS region. The selective changing or altering of the starting material may be done by selectively introducing boron or nitrogen into the starting material in the first one of the NMOS region and the PMOS region to change the starting material to a second one of a metal nitride and a metal boride. The changed material and/or the starting material may then have the desired work function or be close to the desired work function, thus allowing elimination or significant simplification of channel engineering for one or both transistor types.

Figure 2:
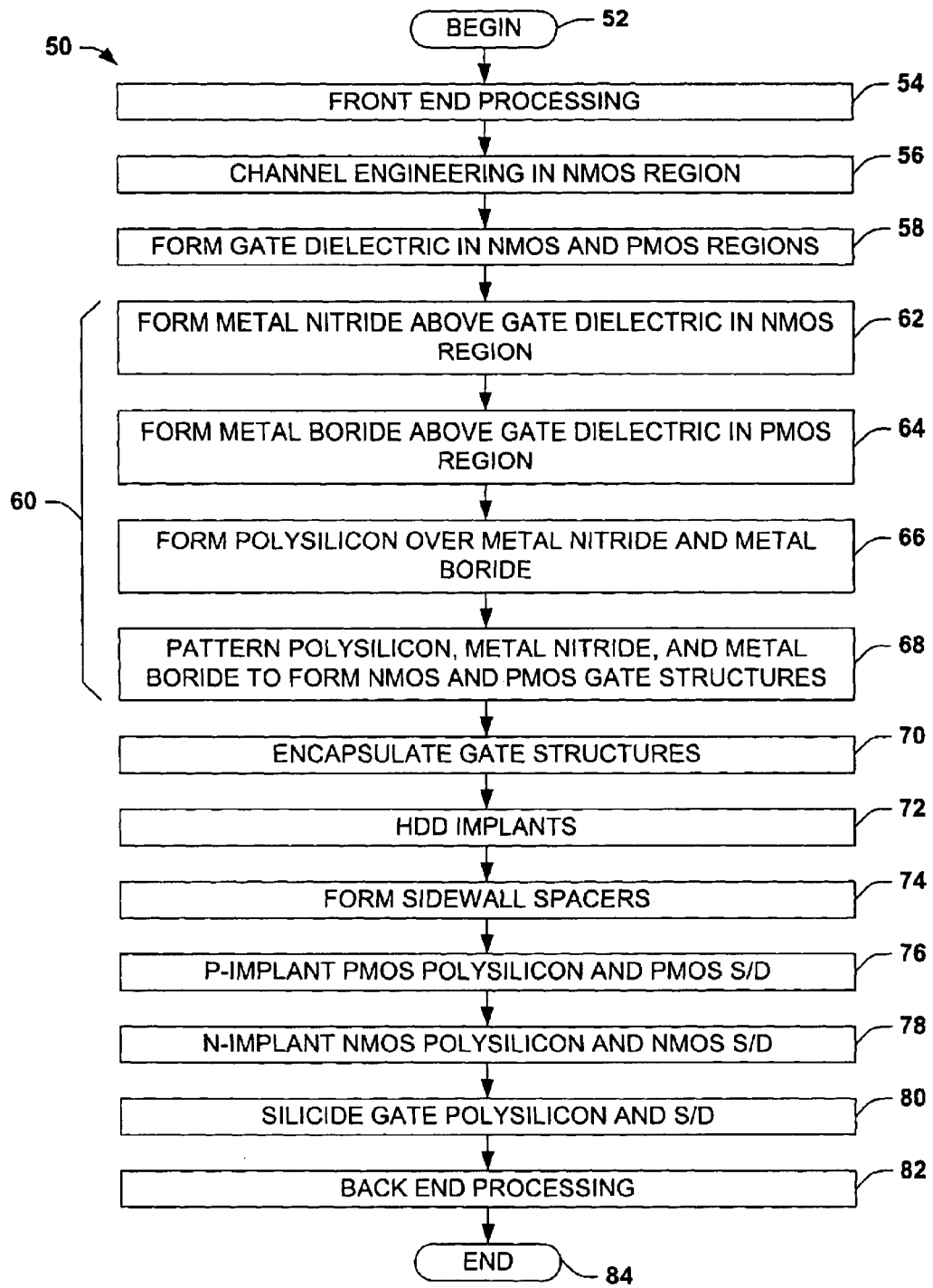
FIG. 2 is a flow diagram illustrating an exemplary method of fabricating tuned PMOS and NMOS metal gate structures in accordance with an aspect of the present invention.

Referring initially to FIGS. 2–3F, an exemplary method 50 is illustrated in FIG. 2 for fabricating metal gate structures for PMOS and NMOS transistors in accordance with the present invention. FIGS. 3A–3F illustrate various exemplary implementations of portions of the method 50 relating to creation of gate structures with differentiated work functions using a single starting material. While the exemplary method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 50 begins at 52 in FIG. 2, wherein front end processing is performed at 54. Any front end processing may be performed within the scope of the invention, wherein the processing at 54 may include, for example, formation of n and p wells using diffusion, implantation, or other suitable processing steps, as well as formation of isolation structures in field regions of a device wafer, using LOCOS, STI, or any suitable isolation processing. The methods and devices of the invention may be implemented using any type of semiconductor body, including but not limited to bulk semiconductor wafers (e.g., silicon), epitaxial layers formed over a bulk semiconductor, SOI wafers, etc.

At 56, channel engineering is optionally performed to adjust the work function of a channel portion of the semiconductor body in prospective NMOS active regions. The NMOS channel engineering at 56 may include, for example, a shallow Vt adjust implant to introduce boron or other p-type dopants into the NMOS channel regions with the PMOS regions masked, as well as a boron punch-thru implant to suppress punch-through, and a somewhat deeper boron channel stop implant. The Vt adjust implant at 56 may be employed to raise the NMOS channel work function to compensate for deviation in the final NMOS gate work function from about 4.2 eV.

At 58, a gate dielectric is formed in the NMOS and PMOS regions using any suitable materials, material thicknesses, and processing steps, including a single thermal oxidation or deposition or combinations thereof to form a gate dielectric above the semiconductor body, which may be a single layer or multiple layers. The invention may be employed in conjunction with any gate dielectric material, such as $SiO_2$, SiON, high-k dielectrics, and stacks or combinations thereof, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others. Separate processing may optionally be employed to form different gate dielectrics in the NMOS and PMOS regions within the scope of the invention. In the examples illustrated and described herein, a single thermal oxidation is performed at 58 to create a thin $SiO_2$ gate dielectric oxide overlying the substrate in the NMOS and PMOS regions.

Following gate dielectric formation at 58, the method 50 provides for gate fabrication indicated generally at 60, wherein FIG. 2 illustrates the general metal gate fabrication principles of the method 50, and FIGS. 3A–3F illustrate a few exemplary implementations of the gate fabrication 60, as described further below. At 62 in FIG. 2, metal nitride is formed above the gate dielectric in the NMOS region to any suitable thickness, any relative component concentration (uniform or profiled), using any suitable deposition process. At 64, metal boride is formed above the gate dielectric in the PMOS region, to any suitable thickness, any relative component concentration (uniform or profiled), using any suitable deposition techniques. Either or both of the metal boride and the metal nitride may directly overlie the gate dielectric or may be formed over one or more intervening material layers within the scope of the invention.

Any metal nitride and metal boride material may be used within the scope of the invention, including but not limited to metals containing nitrogen or metal alloys containing nitrogen, and metals containing boron or metal alloys containing boron, respectively, of any stoichiometry or relative concentrations of metal/metal alloy and nitrogen/boron. The materials may be formed using any metals, ternary metals, or metal alloys within the scope of the invention, for example, those that include Ti, Ta, Hf, Zr, W, or others. Thus, although illustrated and described in the examples below primarily in the context of TiN and $TiB_2$, metal nitrides including but not limited to metal nitrides $M_XN_Y$, metal silicon nitrides $M_XSi_YN_Z$, metal aluminum nitrides $M_XAl_YN_Z$, and metal aluminum silicon nitrides $M_WAl_XSi_YN_Z$ (where M is a metal such as Ti, Ta, Hf, Zr, W, etc.), or equivalents may be used within the scope of the invention. In addition, any metal borides may be employed within the scope of the invention, including but not limited to metal borides $M_XB_Y$, metal silicon borides $M_XSi_YB_Z$, metal aluminum borides $M_XAl_YB_Z$, and metal aluminum silicon borides $M_WAl_XSi_YB_Z$ (where M is a metal such as Ti, Ta, Hf, Zr, W, etc.), or equivalents, wherein all such variations or combinations thereof are contemplated as falling within the scope of the present invention and the appended claims.

Different processing steps may be used at 62 and 64 or some processing operations thereof may be concurrently performed in both the NMOS and PMOS regions within the scope of the invention. Poly-silicon, tungsten, or other suitable upper conductive material is optionally formed above the metal nitride of the NMOS regions and above the metal boride of the PMOS regions at 66, and the upper conductive material, the metal nitride, and the metal boride are patterned at 68 to form NMOS and PMOS gate structures. The upper conductive material may directly overlie the NMOS metal nitride and the PMOS metal boride, or may be formed over one or more intervening material layers within the scope of the invention. As described below with respect to FIGS. 3A–3F, a single metal boride or a metal nitride starting material is initially formed for the metal gate contact portion of the gate structures of both PMOS and NMOS devices in the exemplary method 50. The starting material is then provided with boron or nitrogen in one of the PMOS and NMOS regions through implantation, diffusion, or other suitable techniques, either before or after formation of an upper conductive material, and before or after gate patterning. The change in the boron or nitrogen content of the starting material provides adjustment of the material work function, thereby tuning the threshold voltage of the resulting PMOS or NMOS transistors without significant channel engineering, and without the process complications inherent in using two different starting metal materials. As described in greater detail below, an initial metal nitride (e.g., TiN) is formed in the examples of FIGS. 3A–3E (e.g., and device 302 in FIGS. 4A–4I), and the PMOS portion is then provided with boron to create the PMOS metal boride. In the example of FIG. 3F (e.g., and device 402 in FIGS. 5A–5F), an initial metal boride (e.g., $TiB_2$) is formed and the NMOS portion thereof is provided with nitrogen to create the NMOS metal nitride.

As illustrated in FIG. 2, after gate fabrication at 60, the patterned gate structures are optionally encapsulated at 70 using any suitable materials and processing steps. Highly-doped drain (HDD) implants are performed at 72 to introduce p-type dopants (e.g., boron, etc.) into prospective PMOS source/drains and to provide n-type dopants (e.g., arsenic, phosphorus, etc.) to prospective NMOS source/drains, using any suitable processing steps and operational parameters, wherein the patterned gate structures and isolation structures operate as an implantation mask in the illustrated example. At 74, sidewall spacers are formed along the lateral sidewalls of the patterned gate structures, using any suitable process techniques and materials, for example, depositing and etching $SiO_2$, $Si_3N_4$, etc.

A PMOS source/drain implant is performed at 76, providing boron or other p-type impurities to the PMOS region of the semiconductor body and to the PMOS gate poly-silicon, wherein the NMOS region is masked. Any suitable implantation techniques, operational settings, and implant species may be employed at 76 to further define the PMOS source/drains in the semiconductor body (and to render the PMOS gate poly-silicon conductive where the upper conductive material is poly-silicon). At 78, an NMOS source/drain implant is performed to provide arsenic, phosphorus or other n-type impurities to the NMOS region of the semiconductor body (e.g., and where the upper conductive material is poly-silicon, to the NMOS gate poly-silicon above the metal nitride), with the PMOS region masked. Any suitable implantation techniques, operational settings, and implant species may be employed at 78 to further define the NMOS source/drains, wherein the implants at 76 and 78 may be performed in any order. The source/drains and gates are silicided at 80 and back end processing (e.g., interconnect metalization, etc.) is performed at 82, before the exemplary method 50 ends at 84.

Figure 4A:
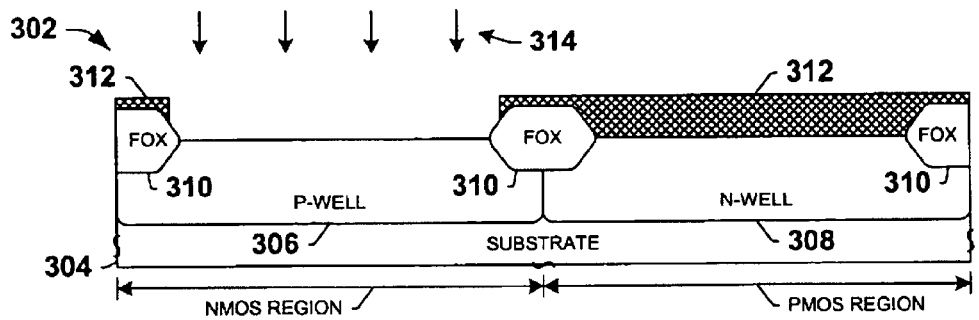
FIGS. 4A–4I are partial side elevation views in section illustrating exemplary NMOS and PMOS transistors undergoing CMOS metal gate processing in accordance with the invention at various stages of fabrication.
Figure 4B:
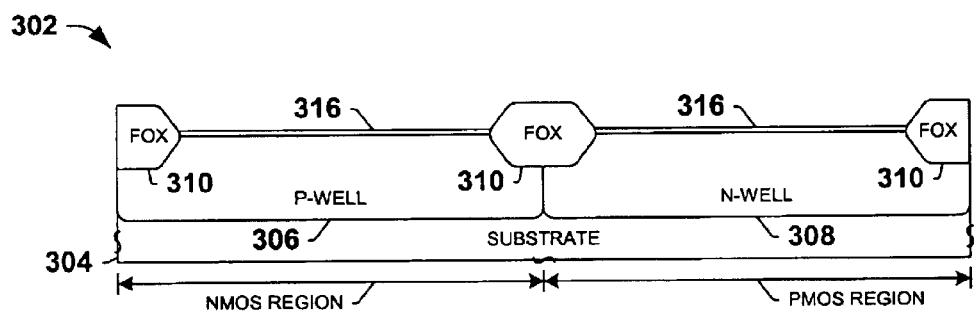
Figure 4C:
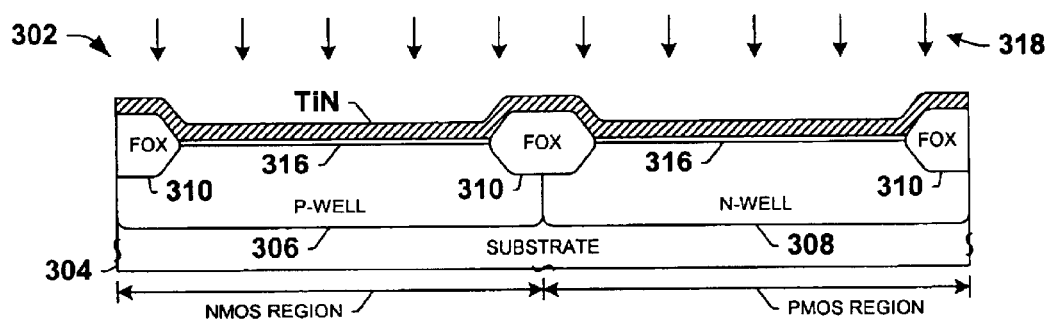
Figure 4D:
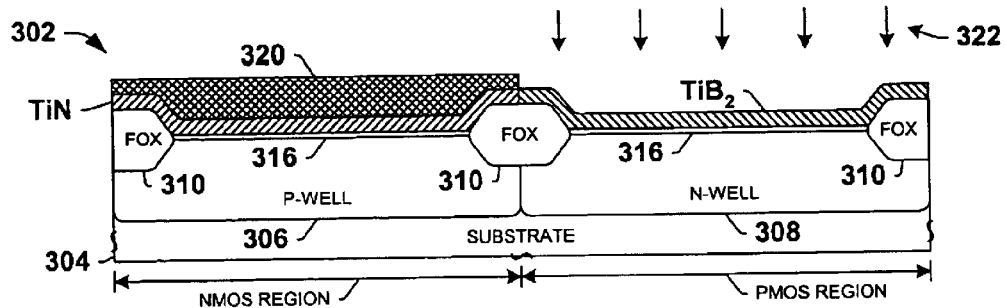

Referring now to FIGS. 2, 3A, and 4A–4I, an exemplary CMOS device 302 is illustrated in FIGS. 4A–4I at various stages of fabrication processing generally according to the method 50. In this example, the gate fabrication for the NMOS and PMOS transistors (e.g., 60 in method 50 of FIG. 2) is illustrated in further detail in FIG. 3A, wherein an initial metal nitride starting material (e.g., $M_XN_Y$, $M_XSi_YN_Z$, $M_XAl_YN_Z$, $M_WAl_XSi_YN_Z$, or equivalents thereof, where M is a metal such as Ti, Ta, Hf, Zr, W, etc.; TiN in the present example) is formed over the gate dielectric in both the NMOS and PMOS regions. The metal nitride in the PMOS region is then implanted with boron to create the PMOS metal boride. As illustrated in FIG. 4A, the CMOS device 302 includes a silicon substrate semiconductor body 304 with a p-well 306 formed in an NMOS region and an n-well 308 formed in a PMOS region. The device 302 further comprises field oxide (FOX) isolation structures 310, where the wells 306, 308 and the field oxide 310 are formed during front-end processing (e.g., at 54 in FIG. 2). A mask 312 is formed that covers the PMOS region and exposes the NMOS region, and one or more NMOS channel engineering implantation processes 314 are performed (e.g., 56 in FIG. 2), which may include a Vt adjust implant to introduce boron or other p-type dopants into a prospective NMOS channel region, as well as a boron punch-thru implant, and a boron channel stop implant. In FIG. 4B, a gate dielectric layer 316 is formed above the substrate 314 in both the NMOS and the PMOS regions (58 in FIG. 2). Gate fabrication in the device 302 (FIGS. 4C–4F) then proceeds as indicated generally at 60a in FIG. 3A. In FIG. 4C, a TiN (e.g., or other metal nitride material) is deposited over the gate dielectric 316 to any suitable thickness via a CVD, ALD, PVD, or other suitable deposition process 318 (100 in FIG. 3A) in both the NMOS and PMOS regions.

In this implementation of the invention (e.g., and others described below with respect to FIGS. 3B–3E), metal boride (e.g., $M_XB_Y$, $M_XSi_YB_Z$, $M_XAl_YB_Z$, $M_WAl_XSi_YB_Z$ or equivalents thereof, where M is a metal such as Ti, Ta, Hf, Zr, W, etc.) is formed above the gate dielectric in the PMOS region by forming the initial TiN therein and then introducing boron into the PMOS TiN to form $TiB_2$. In the exemplary device 302, boron or boron-containing dopants (e.g., B, $BF_2$, etc.) are selectively implanted into the TiN to form the $TiB_2$ metal boride in the PMOS region. Toward that end, a mask 320 is formed in FIG. 4D (102 in FIG. 3A) to cover the NMOS region and expose the PMOS region. An implantation process 322 is performed (104 in FIG. 3A) to provide the boron or boron-containing dopants directly into the PMOS region TiN, thus creating $TiB_2$ over the PMOS gate dielectric 316, after which the mask 320 is removed (106 in FIG. 3A). The operational settings of the implantation process 322 (e.g., energy, dose, etc.) may be selected to provide the boron throughout all or a portion of the unmasked TiN starting material at any suitable concentrations and depth profiles thereof, wherein boron is preferably introduced near the gate dielectric 316, without doping the dielectric 316 or the underlying channel region of the substrate 304.

Figure 4E:
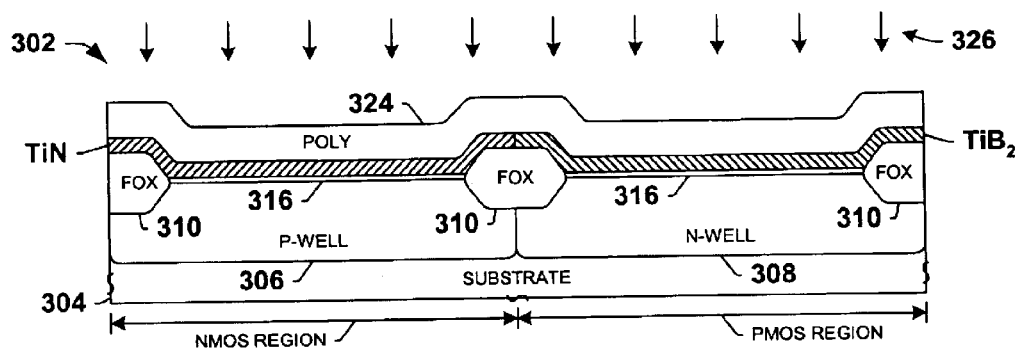
Figure 4F:
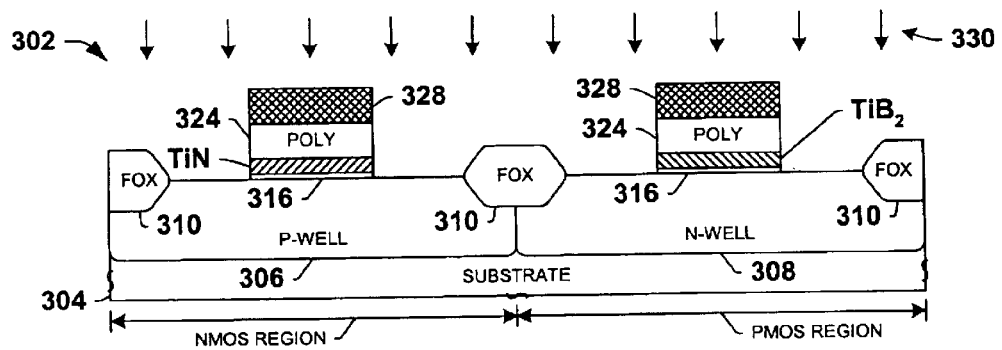
Figure 4G:
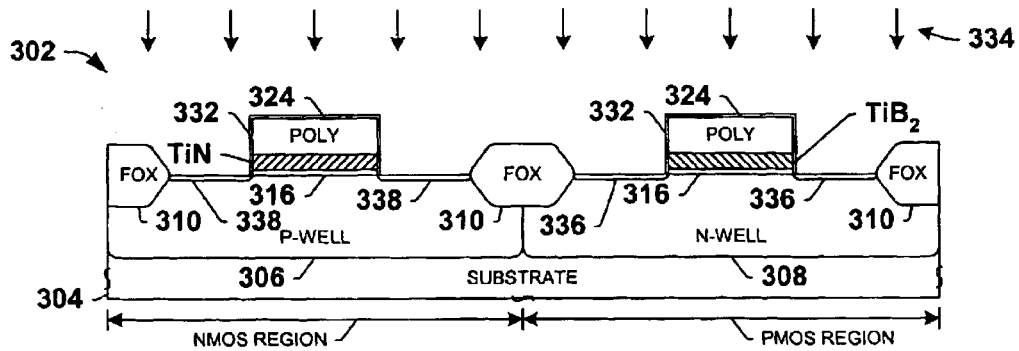
Figure 4H:
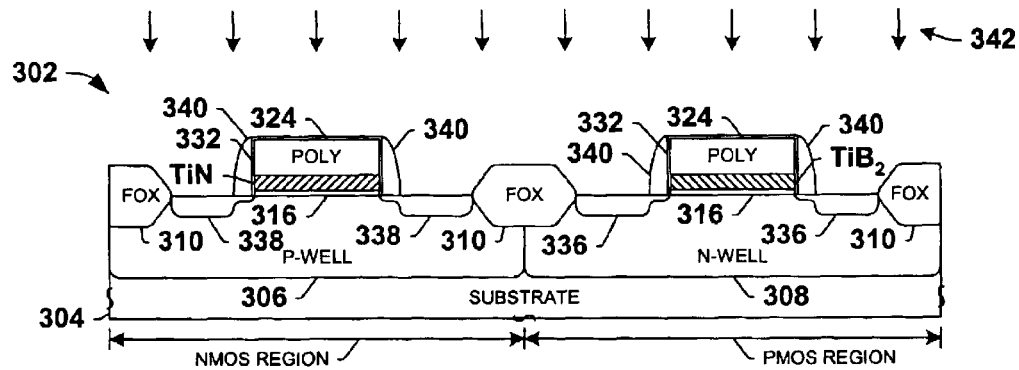

In FIG. 4E, poly-silicon 324 is deposited (108 in FIG. 3A) over the NMOS TiN and over the PMOS $TiB_2$, using any suitable deposition process 326. Other implementations of the invention are possible, which alternatively employ tungsten or other conductive material. In FIG. 4F, the poly-silicon 324, the NMOS TiN, and the PMOS $TiB_2$ are patterned (110 in FIG. 3A) using a mask 328 and an etch process 330 to define patterned NMOS and PMOS gate structures. The mask 328 is then removed and the patterned gate structures are encapsulated (70 In FIG. 2) by forming a single or multi-layer encapsulation structure 332 along the sidewalls and top of the gate structures, as illustrated in FIG. 4G. HDD implants 334 are performed (72 in FIG. 2) in FIG. 4G to introduce p-type dopants into prospective PMOS source/drains 336 and to introduce n-type dopants into prospective NMOS source/drains 338, wherein the field oxide 310 and patterned gate structures operate as an implantation mask. In FIG. 4H, $SiO_2$ or $Si3N_4$ sidewall spacers 340 are formed along the lateral sidewalls of the patterned gate structures (74 in FIG. 2), and source/drain implants 342 are performed (76 and 78 in FIG. 2) using suitable masks (not shown) to further define the source/drains 336 and 338 and to provide p-type and n-type dopants to the PMOS and NMOS gate poly-silicon 324.

Figure 4I:
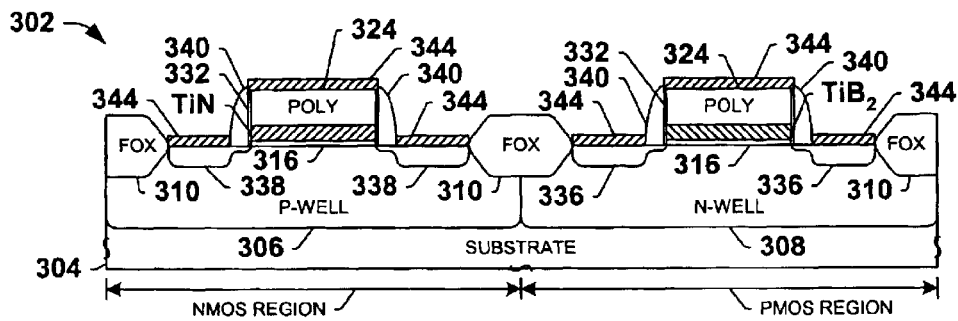

Thereafter in FIG. 4I, self-aligned silicide contacts 344 (salicide) are formed (80 in FIG. 2) over the source/drains 336, 338, and the doped gate poly-silicon 324, after which metalization and other back-end processing (82 in FIG. 2) may be performed (not shown in FIG. 4I). In the implementations of FIGS. 3A–3E), metal boride is formed above the gate dielectric in the PMOS region through the initial formation of the TiN therein followed by introduction of boron into the PMOS TiN to form $TiB_2$. In the example of FIGS. 2, 3A, and 4A–4I, the boron dopants are implanted into the TiN in the PMOS region prior to forming the poly-silicon 324. Other implementations are possible wherein the poly-silicon is formed prior to introducing boron into the metal nitride on the PMOS regions.

Referring now to FIG. 3B, another variant implementation 60b of the gate fabrication processing 60 in the method 50 of FIG. 2 is illustrated. With the gate dielectric formed, TiN (e.g., or other metal nitride material) is deposited at 120 over the gate dielectric to any suitable thickness via a CVD, ALD, PVD, or other suitable deposition process. At 122, poly-silicon is deposited over the TiN in both the NMOS and PMOS regions, and the poly-silicon and TiN may be optionally patterned at 124*a* to form PMOS and NMOS gate structures. The NMOS region is masked at 126, and a boron implant (e.g., boron, $BF_2$, or other boron-containing dopant) is performed at 128 through the PMOS poly-silicon and into the underlying TiN in the PMOS region to form metal boride. The implant mask is removed at 130 and (if not already done at 124*a*), the gate structures are patterned at 124*b*.

FIG. 3C illustrates yet another possible gate fabrication approach 60*c* within the scope of the invention, in which the boron is implanted into the PMOS poly-silicon and then thermally driven into the underlying TiN to form $TiB_2$ in the PMOS region. At 150, TiN or other metal nitride is deposited over the gate dielectric, and poly-silicon is formed at 152. The NMOS region is masked at 154, and boron dopants are implanted at 156 into the poly-silicon of the exposed PMOS region. At 158, the implant mask is removed, and an anneal is performed at 160 to drive or diffuse the implanted p-type dopants (e.g., boron) from the poly-silicon into the underlying TiN in the PMOS region, thereby forming metal boride in the PMOS region (e.g., $TiB_2$). The gate structures are then patterned at 162 to define the NMOS and PMOS gate structures. In this implementation, the gate structures may optionally be patterned following the poly-silicon deposition at 152 within the scope of the invention.

Another gate fabrication approach 60*d* is illustrated in FIG. 3D, wherein boron is introduced into the initial metal nitride of the PMOS region by exposing the metal nitride to a boron-containing ambient in the presence of a thermal anneal or plasma. TiN or other metal nitride is deposited over the gate dielectric at 170, and the NMOS region is masked at 172 (e.g., leaving the PMOS region uncovered). At 174, the exposed TiN in the PMOS region is subjected to a thermal anneal or plasma in a boriding environment (e.g., $B_2H_6$, etc.) to introduce boron into the PMOS TiN, thereby creating a metal boride (e.g., $TiB_2$). The mask is then removed at 176, poly-silicon (e.g., or other upper conductive material, such as tungsten) is deposited at 178, and the poly-silicon, NMOS TiN, and PMOS $TiB_2$ are patterned at 180.

Referring now to FIG. 3E, yet another metal gate fabrication approach 60*e* is illustrated, in which metal nitride (e.g., TiN) is deposited over the gate dielectric at 200, and the NMOS region is masked at 202. To selectively provide boron in the exposed PMOS portion of the deposited TiN, a film or layer of boron-containing material is formed at 204 (e.g., deposited) over the PMOS TiN and over the NMOS mask. An anneal is performed at 206 to diffuse boron from the boron-containing material into the PMOS TiN to form the $TiB_2$ in the PMOS region. The mask and any remaining boron material is removed at 208, poly-silicon or other conductive upper material is deposited at 210, and the poly-silicon, NMOS TiN, and PMOS $TiB_2$ are patterned at 212. Other variations of this approach are possible, for example, wherein a boron-containing film is deposited over the TiN in both the PMOS and NMOS regions, and portions thereof are selectively removed by masking the PMOS region and etching the boron-containing material from the NMOS region. Thereafter, the boron can be diffused into the underlying PMOS region through annealing and further processed as described above.

Figure 5A:
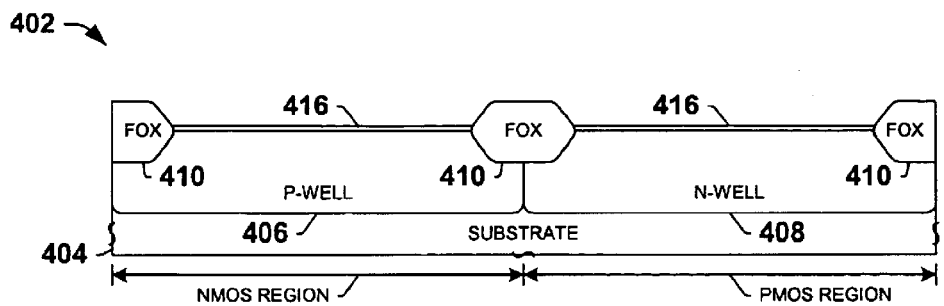
FIGS. 5A–5F are partial side elevation views in section illustrating exemplary NMOS and PMOS transistors undergoing CMOS metal gate processing in accordance with another implementation of the invention.

Referring now to FIGS. 2, 3F, and 5A–5F, another technique for forming metal nitride (e.g., TiN) in the NMOS gate structures and metal boride (e.g., $TiB_2$) in the PMOS gate structures involves depositing a metal boride starting material above the gate dielectric in both the NMOS and PMOS regions. Thereafter, nitrogen is selectively introduced into the metal boride to form metal nitride in the NMOS region. One example of this gate fabrication technique 60*f* is presented in FIG. 3F, and an exemplary CMOS device 402 is illustrated in FIGS. 5A–5F undergoing fabrication processing according to this approach. In FIG. 5A, the device 402 is illustrated comprising a silicon substrate semiconductor body 404 with a p-well 406 formed in an NMOS region and an n-well 408 formed in a PMOS region, along with field oxide isolation structures 410. The wells 406, 408 and the field oxide 410 may be formed using any suitable front-end processing (e.g., at 54 in FIG. 2). Any required channel engineering steps (e.g., 56 in FIG. 2, such as NMOS Vt adjust implants, channel-stop implants, punch-thru implants, not shown) are performed prior to forming a gate dielectric oxide 416 (58 in FIG. 2) in both the NMOS and PMOS regions.

Figure 5B:
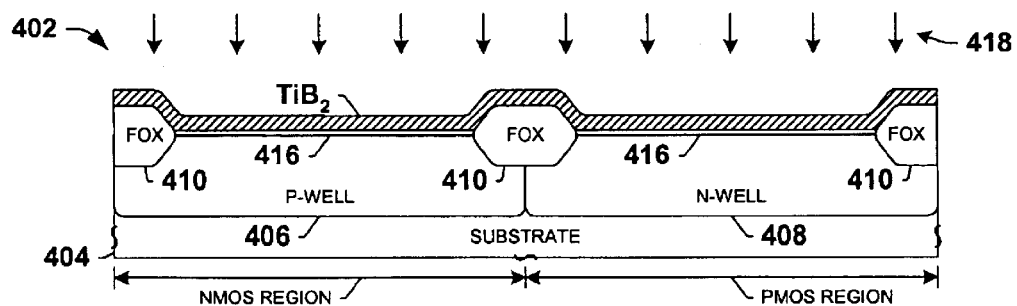
Figure 5C:
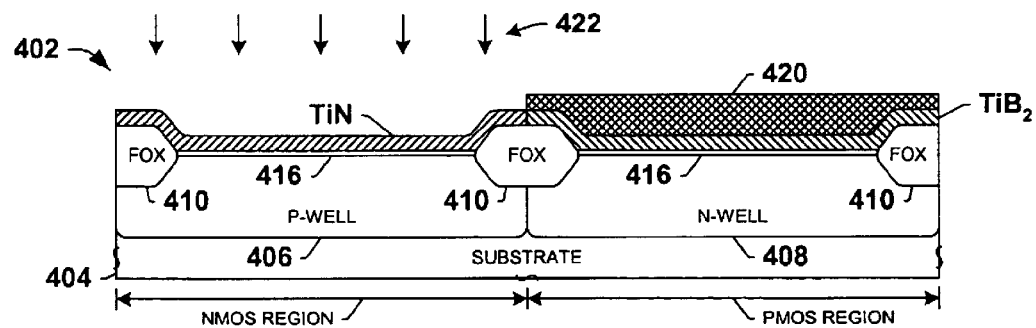

In FIG. 5B, $TiB_2$ or other metal boride is formed (220 in FIG. 3F) to any suitable thickness over the gate dielectric 416 in both the NMOS and PMOS regions, using any suitable deposition process 418. A mask 420 is formed in FIG. 5C (222 of FIG. 3F) to cover the PMOS region, leaving the $TiB_2$ of the NMOS region exposed. Nitrogen is then selectively provided to the exposed NMOS $TiB_2$ (224 in FIG. 3F) via a nitridation process 422 to form metal nitride (e.g., TiN) above the gate dielectric 416 in the PMOS region, as shown in FIG. 5C. Any suitable process 422 may be used to provide nitrogen in accordance with the invention. In one example, the process 422 is an ammonia anneal to form the metal nitride in the PMOS region. In another possible implementation, a plasma nitridation process is performed at 422 to form the metal nitride in the PMOS region, wherein annealing or subsequent thermal processing may be tailored to locate the nitrogen at any desired final depth (e.g., at the bottom near the gate dielectric 416). In this regard, the depth, concentration, concentration profile, etc., may be tailored to provide the desired NMOS gate work function (e.g., in combination with any previous NMOS channel engineering).

Figure 5D:
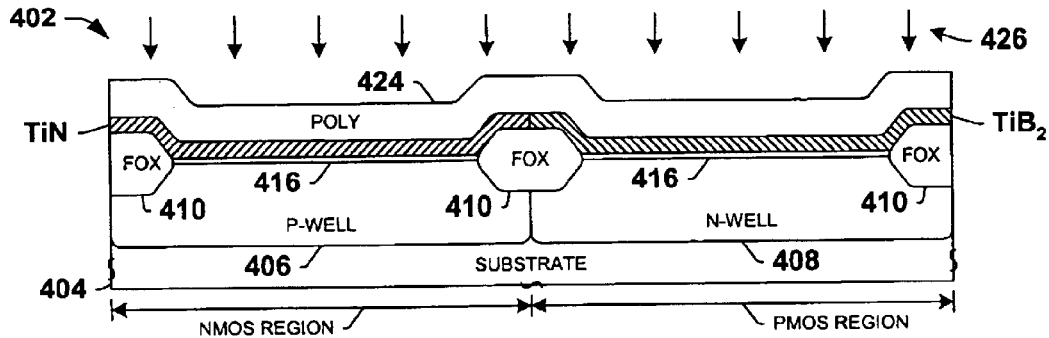
Figure 5E:
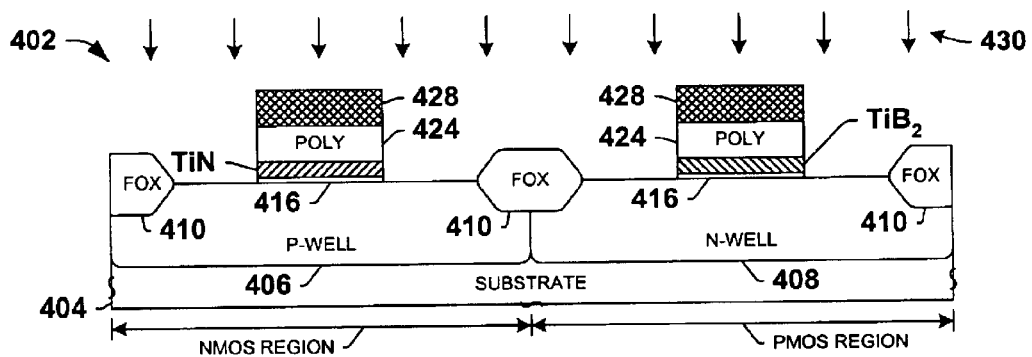
Figure 5F:
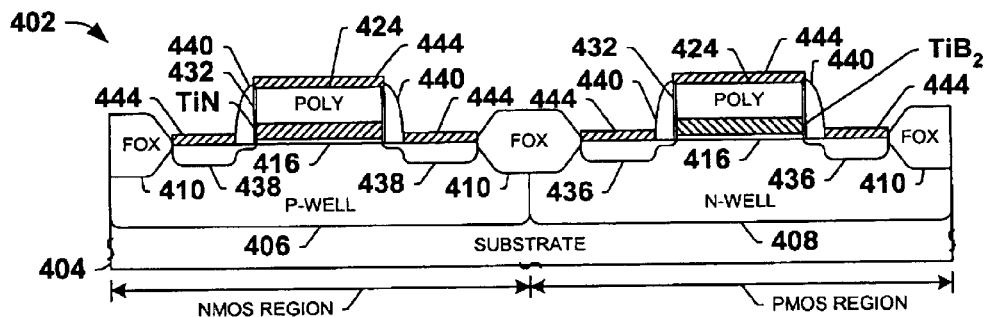

In FIG. 5D, poly-silicon 424 is formed via a deposition process 426 over the NMOS metal nitride and the PMOS metal boride (226 in FIG. 3F), and the poly-silicon, metal nitride, and metal boride are patterned in FIG. 5E (228 of FIG. 3F) using a mask 428 and an etch process 430 to define the NMOS and PMOS gate structures. Thereafter in FIG. 5F, an encapsulation structure 432 is formed (70 in FIG. 2) over the patterned gate structures, and HDD implants are performed (72 in FIG. 2) to provide dopants into PMOS and NMOS source/drains 436 and 438, respectively. Sidewall spacers 440 are formed (74 in FIG. 2) along the lateral sidewalls of the patterned gate structures (74 in FIG. 2), after which p-type and n-type source/drain implants are performed (76 and 78 in FIG. 2) to further define the source/drains 436 and 438 and to provide p-type and n-type dopants to the PMOS and NMOS gate poly-silicon 424. Silicide contacts 444 are then formed (80 in FIG. 2) over the source/drains 436, 438, and the doped gate poly-silicon 424, after which metalization and other back-end processing (82 in FIG. 2) may be performed (not shown).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating PMOS and NMOS metal gate structures in a semiconductor device, the method comprising:
   forming a gate dielectric in PMOS and NMOS regions above a semiconductor body;
   forming a metal nitride above the gate dielectric in the NMOS region;
   forming a metal boride above the gate dielectric in the PMOS region;
   patterning the metal nitride to form an NMOS gate structure in the NMOS region; and
   patterning the metal boride to form a PMOS gate structure in the PMOS region;
   wherein forming the metal boride above the gate dielectric in the PMOS region comprises:
      forming a metal nitride above the gate dielectric in the PMOS region; and
      introducing boron into the metal nitride to form the metal boride in the PMOS region.

2. The method of claim 1, wherein introducing boron into the metal nitride in the PMOS region comprises selectively implanting boron or boron-containing dopants into the metal nitride to form the metal boride in the PMOS region.

3. The method of claim 2, wherein the boron or boron-containing dopants are implanted into the metal nitride in the PMOS region prior to forming a conductive upper material above the metal boride in the PMOS region.

4. The method of claim 1, further comprising:
   forming a conductive upper material above the metal nitride in the NMOS region; and
   forming a conductive upper material above the metal boride in the PMOS region;
   wherein the conductive upper material is formed in the PMOS region prior to introducing boron into the metal nitride in the PMOS region.

5. The method of claim 4, wherein the conductive upper material is poly-silicon, and wherein introducing boron into the metal nitride in the PMOS region comprises selectively implanting boron or boron-containing dopants through the poly-silicon and into the metal nitride to form the metal boride in the PMOS region.

6. The method of claim 4, wherein the conductive upper material is poly-silicon, and wherein introducing boron into the metal nitride in the PMOS region comprises:
   implanting boron or boron-containing dopants into the poly-silicon in the PMOS region; and
   diffusing at least some of the boron or boron-containing dopants from the poly-silicon into the metal nitride to form the metal boride in the PMOS region.

7. The method of claim 1, wherein introducing boron into the metal nitride in the PMOS region comprises exposing the metal nitride to a boron-containing ambient to form the metal boride in the PMOS region.

8. The method of claim 7, wherein introducing boron into the metal nitride in the PMOS region comprises annealing the metal nitride in a boron-containing ambient to form the metal boride in the PMOS region.

9. The method of claim 7, wherein introducing boron into the metal nitride in the PMOS region comprises exposing the metal nitride to a plasma in the boron-containing ambient to form the metal boride in the PMOS region.

10. The method of claim 1, wherein introducing boron into the metal nitride in the PMOS region comprises:
    forming a boron-containing material over the metal nitride; and
    diffusing boron from the boron-containing material into the metal nitride to form the metal boride in the PMOS region.

11. The method of claim 1, wherein the metal nitride is one of $M_XN_Y$, $M_XSi_YN_Z$, $M_XAl_YN_Z$, and $M_WAl_XSi_YN_Z$, where M is one of Ti, Ta, Hf, Zr, and W.

12. The method of claim 1, wherein the metal boride is one of $M_XB_Y$, $M_XSi_YB_Z$, $M_XAl_YB_Z$, and $M_WAl_XSi_YB_Z$ where M is one of Ti, Ta, Hf, Zr, and W.

13. The method of claim 1, wherein the metal nitride is TiN and the metal boride is $TiB_2$.

14. A method of fabricating PMOS and NMOS metal gate structures in a semiconductor device, the method comprising:
    forming a gate dielectric in PMOS and NMOS regions above a semiconductor body;
    forming a metal nitride above the gate dielectric in the NMOS region;
    forming a metal boride above the gate dielectric in the PMOS region;
    patterning the metal nitride to form an NMOS gate structure in the NMOS region; and
    patterning the metal boride to form a PMOS gate structure in the PMOS region;
    wherein forming metal nitride above the gate dielectric in the NMOS region comprises:
       forming metal boride above the gate dielectric in the NMOS region; and
       introducing nitrogen into the metal boride to form the metal nitride in the PMOS region.

15. The method of claim 14, wherein introducing nitrogen into the metal boride comprises performing an ammonia anneal to form the metal nitride in the PMOS region.

16. The method of claim 14, wherein introducing nitrogen into the metal boride comprises performing a plasma nitridation process to form the metal nitride in the PMOS region.

17. The method of claim 14, wherein the metal nitride is one of $M_XN_Y$, $M_XSi_YN_Z$, $M_XAl_YN_Z$, and $M_WAl_XSi_YN_Z$, where M is one of Ti, Ta, Hf, Zr, and W.

18. The method of claim 14, wherein the metal boride is one of $M_XB_Y$, $M_XSi_YB_Z$, $M_XAl_YB_Z$, and $M_WAl_XSi_YB_Z$ where M is one of Ti, Ta, Hf, Zr, and W.

19. The method of claim 14, wherein the metal nitride is TiN and the metal boride is $TiB_2$.

20. A method of fabricating PMOS and NMOS metal gate structures in a semiconductor device, the method comprising:
    forming a gate dielectric on PMOS and NMOS regions above a semiconductor body;
    forming a starting material above the gate dielectric in both the NMOS region and the PMOS region, the starting material being a metal nitride or a metal boride;

changing the starting material in a first one of the NMOS region and the PMOS region such that a metal nitride is provided above the gate dielectric in the NMOS region and a metal boride is provided above the gate dielectric in the PMOS region;

patterning the metal nitride to form an NMOS gate structure in the NMOS region; and patterning the metal boride to form a PMOS gate structure in the PMOS region.

21. The method of claim 20, wherein the starting material is a metal nitride, and wherein changing the starting material comprises introducing boron into the starting material in the PMOS region to change the starting material to a metal boride in the PMOS region.

22. The method of claim 20, wherein the starting material is a metal boride, and wherein changing the starting material comprises introducing nitrogen into the starting material in the NMOS region to change the starting material to a metal nitride in the NMOS region.

23. A semiconductor device comprising:

an NMOS transistor gate structure, the NMOS gate structure comprising a metal nitride structure and a gate dielectric between the metal nitride structure and a semiconductor body; and a PMOS transistor gate structure, the PMOS gate structure comprising a metal boride structure and a gate dielectric between the metal boride structure and the semiconductor body, wherein the metal boride structure comprises a metal nitride material doped with boron.

24. The device of claim 23, wherein the metal boride structure is one of $M_XB_Y$, $M_XSi_YB_Z$, $M_XAl_YB_Z$, and $M_WAl_XSi_YB_Z$ where M is one of Ti, Ta, Hf, Zr, and W.

25. The device of claim 23, wherein the metal nitride structure comprises TiN and the metal boride structure comprises $TiB_2$.

26. The device of claim 23, further comprising a conductive upper material above the metal nitride structure and above the metal boride structure.

27. The device of claim 26, wherein the conductive upper material is poly-silicon.

28. The device of claim 26, wherein the conductive upper material is tungsten.

29. A semiconductor device comprising:

an NMOS transistor gate structure, the NMOS gate structure comprising a metal nitride structure and a gate dielectric between the metal nitride structure and a semiconductor body; and a PMOS transistor gate structure, the PMOS gate structure comprising a metal boride structure and a gate dielectric between the metal boride structure and the semiconductor body, wherein the metal nitride structure comprises a nitrided metal boride.

30. The device of claim 29, wherein the metal nitride structure is one of $M_XN_Y$, $M_XSi_YN_Z$, $M_XAl_YN_Z$, and $M_WAl_XSi_YN_Z$, where M is one of Ti, Ta, Hf, Zr, and W.

* * * * *